(12) United States Patent
Combs et al.

(10) Patent No.: US 6,875,931 B2
(45) Date of Patent: Apr. 5, 2005

(54) RETAINER FOR CIRCUIT BOARD ASSEMBLY AND METHOD FOR USING THE SAME

(75) Inventors: Christopher D. Combs, Portland, OR (US); Arjang Fartash, Aloha, OR (US); Raiyomand Aspandiar, Porland, OR (US); Tom E. Pearson, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 325 days.

(21) Appl. No.: 10/198,792

(22) Filed: Jul. 18, 2002

(65) Prior Publication Data

US 2004/0011557 A1 Jan. 22, 2004

(51) Int. Cl.$^7$ .......................... H05R 12/04; H05K 1/11
(52) U.S. Cl. ...................... 174/262; 174/252; 174/258; 257/782; 257/785; 257/720; 439/571; 439/573
(58) Field of Search ................ 361/760, 807, 361/776, 801; 174/262, 252, 258; 439/161, 571–573; 257/719–120, 727, 731, 733, 782, 785

(56) References Cited

U.S. PATENT DOCUMENTS 4,487,465 A * 12/1984 Cherian ...................... 439/161
6,280,248 B1 * 8/2001 Mitra .......................... 439/571

* cited by examiner

Primary Examiner—Kamand Cuneo
Assistant Examiner—Hung S. Bui
(74) Attorney, Agent, or Firm—Blakely, Sokoloff, Taylor & Zafman LLP

(57) ABSTRACT

An apparatus to retain an assembled component on one side of a double-sided printed circuit board during reflow of other components subsequently positioned on an opposite side of the double-sided printed circuit board and methods for manufacturing and using the same. The retainer includes a heat-expandable member and a retainer member. Being formed from a heat-expandable material, the heat-expandable member is coupled with the retainer member and is disposed about a periphery thereof. The retainer member is configured to be coupled with a component and, when the component is assembled onto a double-sided printed circuit board, to be received by an opening formed in the double-sided printed circuit board. The heat-expandable member is configured to expand during assembly of the component, engaging an inner surface that defines the opening. Thereby, the component is retained and supported when the double-sided printed circuit board is subsequently inverted, populated, and reflowed.

21 Claims, 10 Drawing Sheets

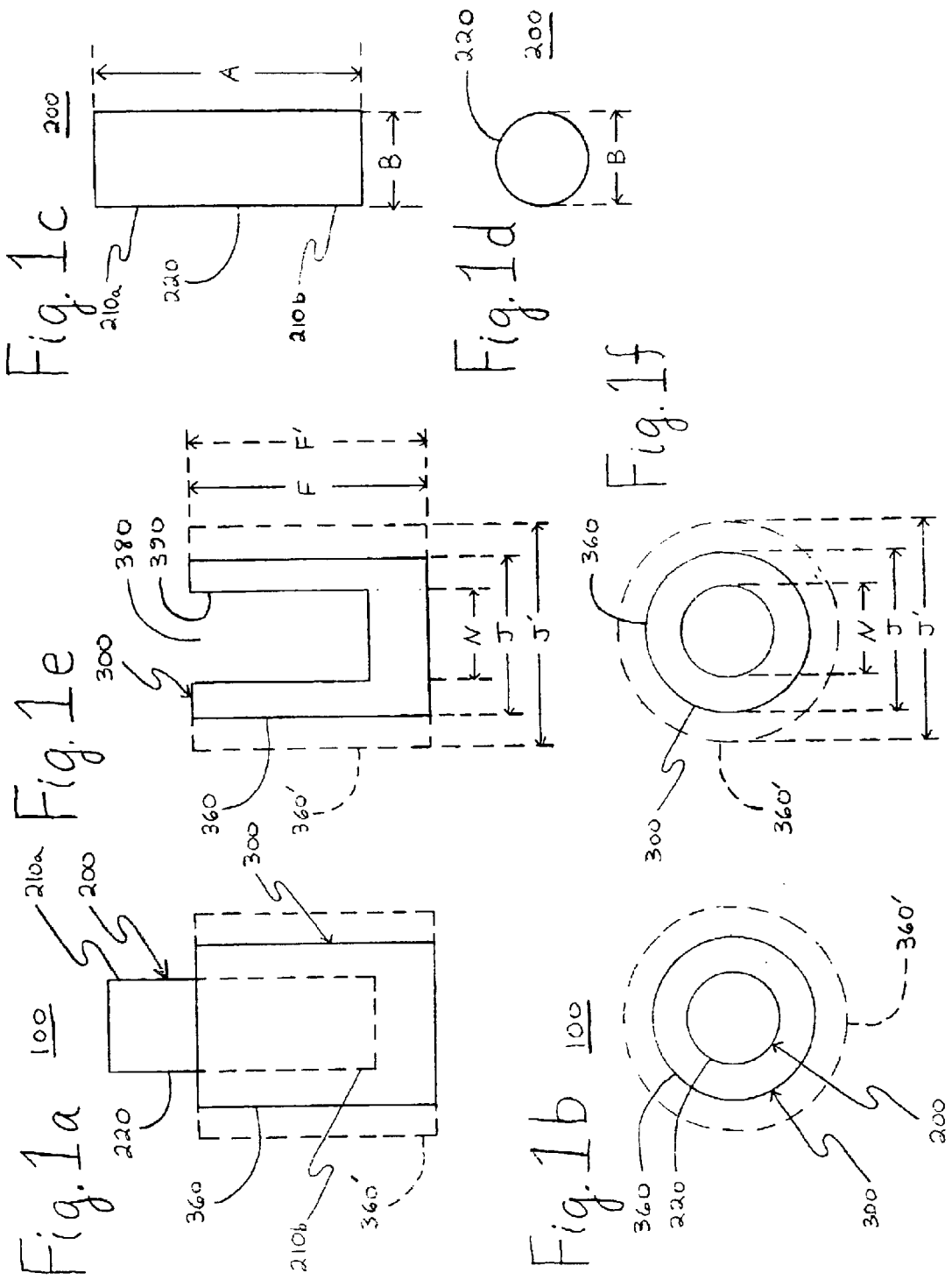

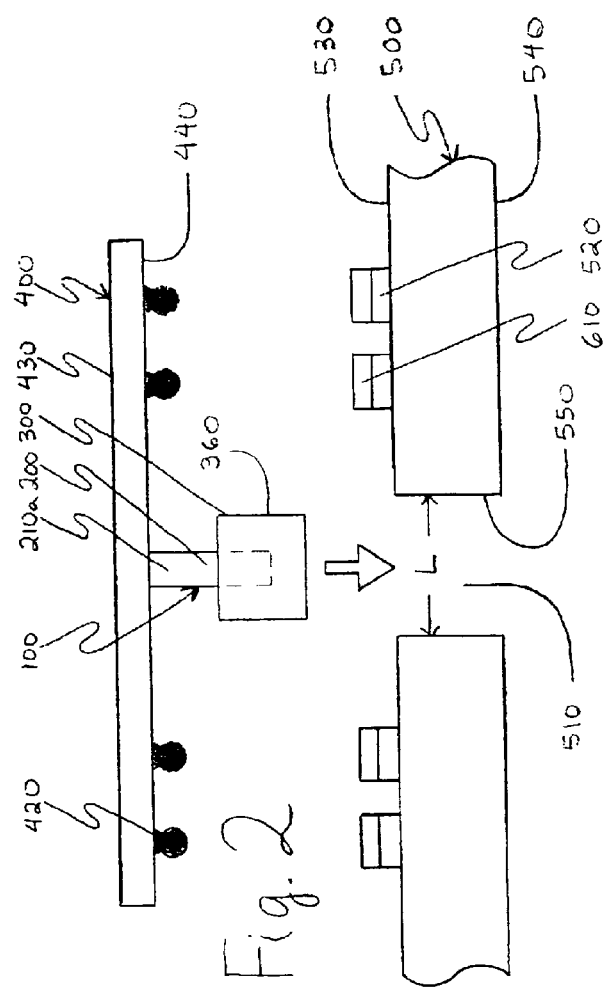
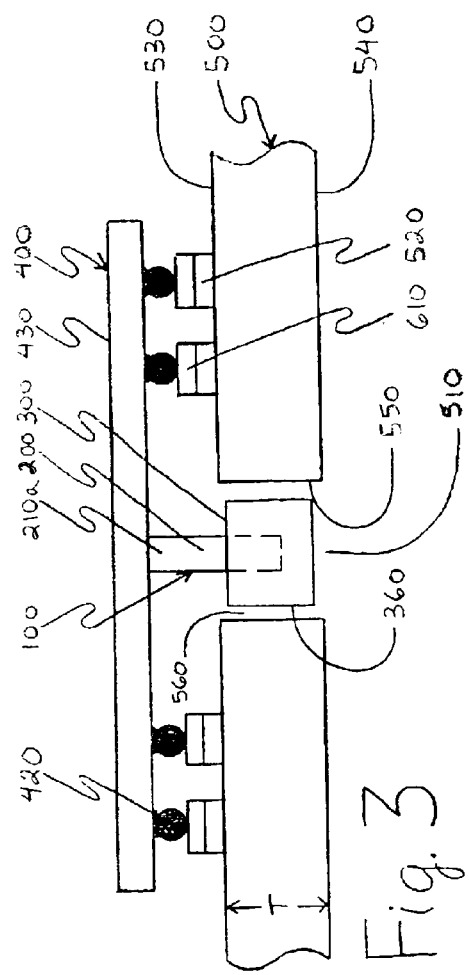

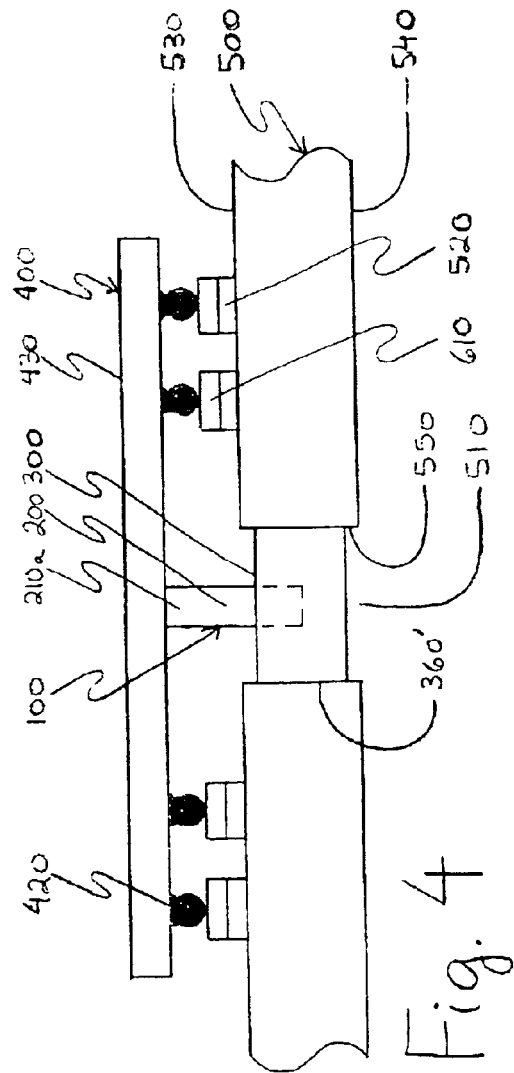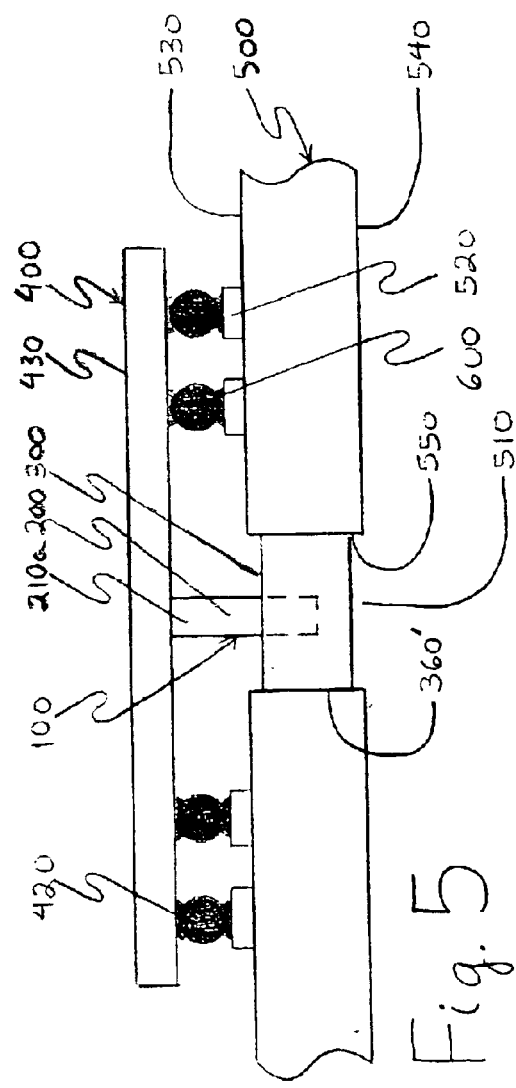

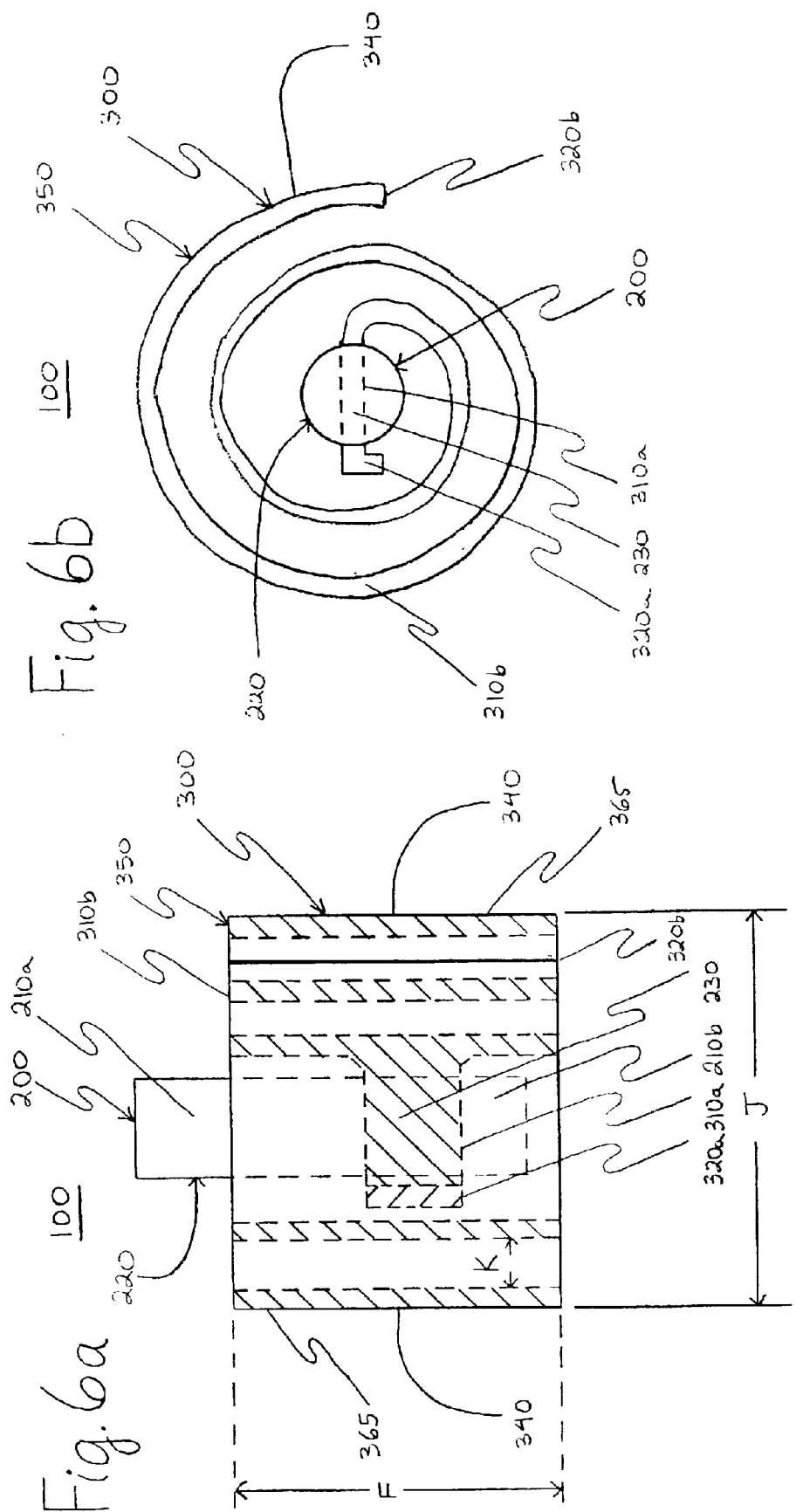

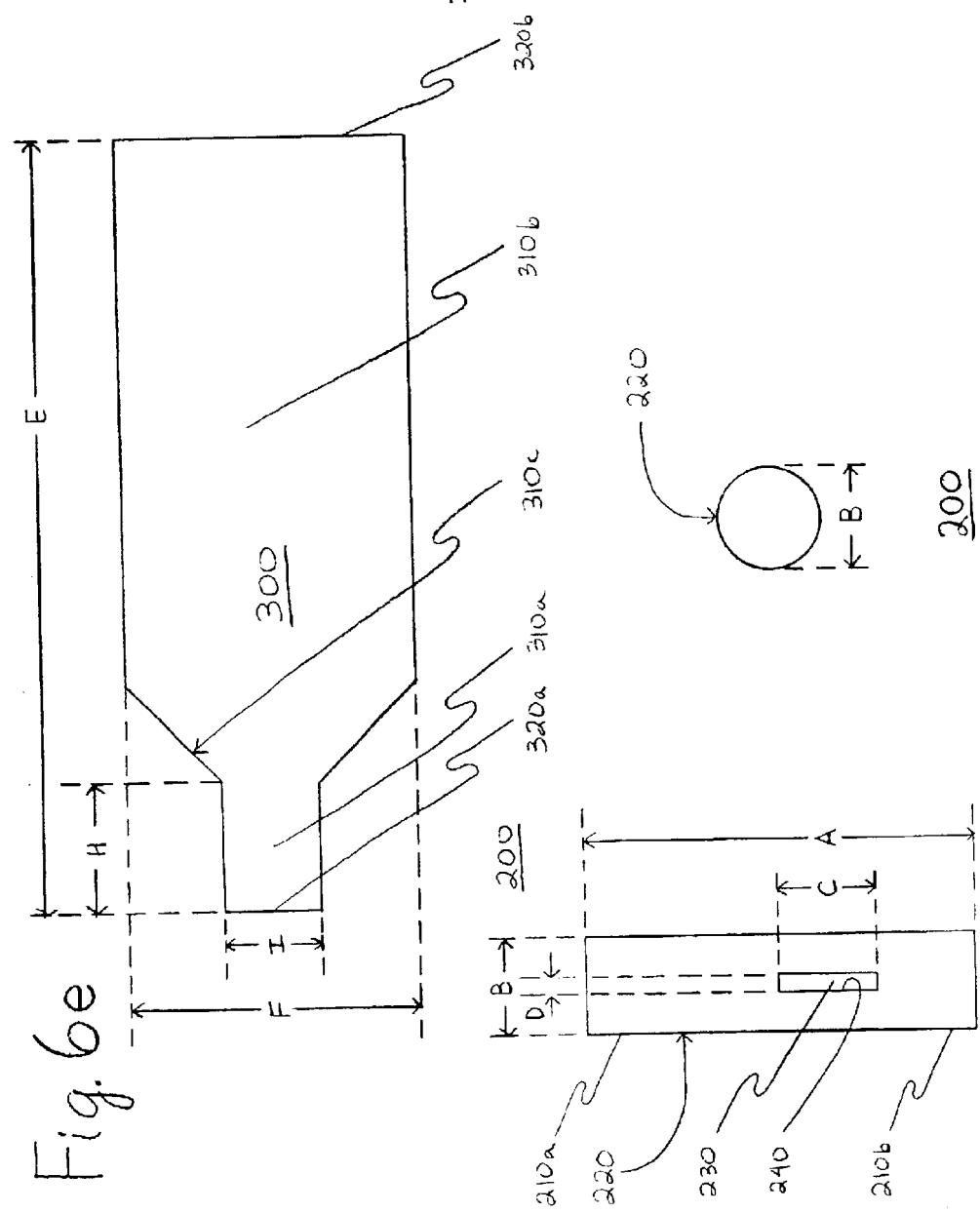

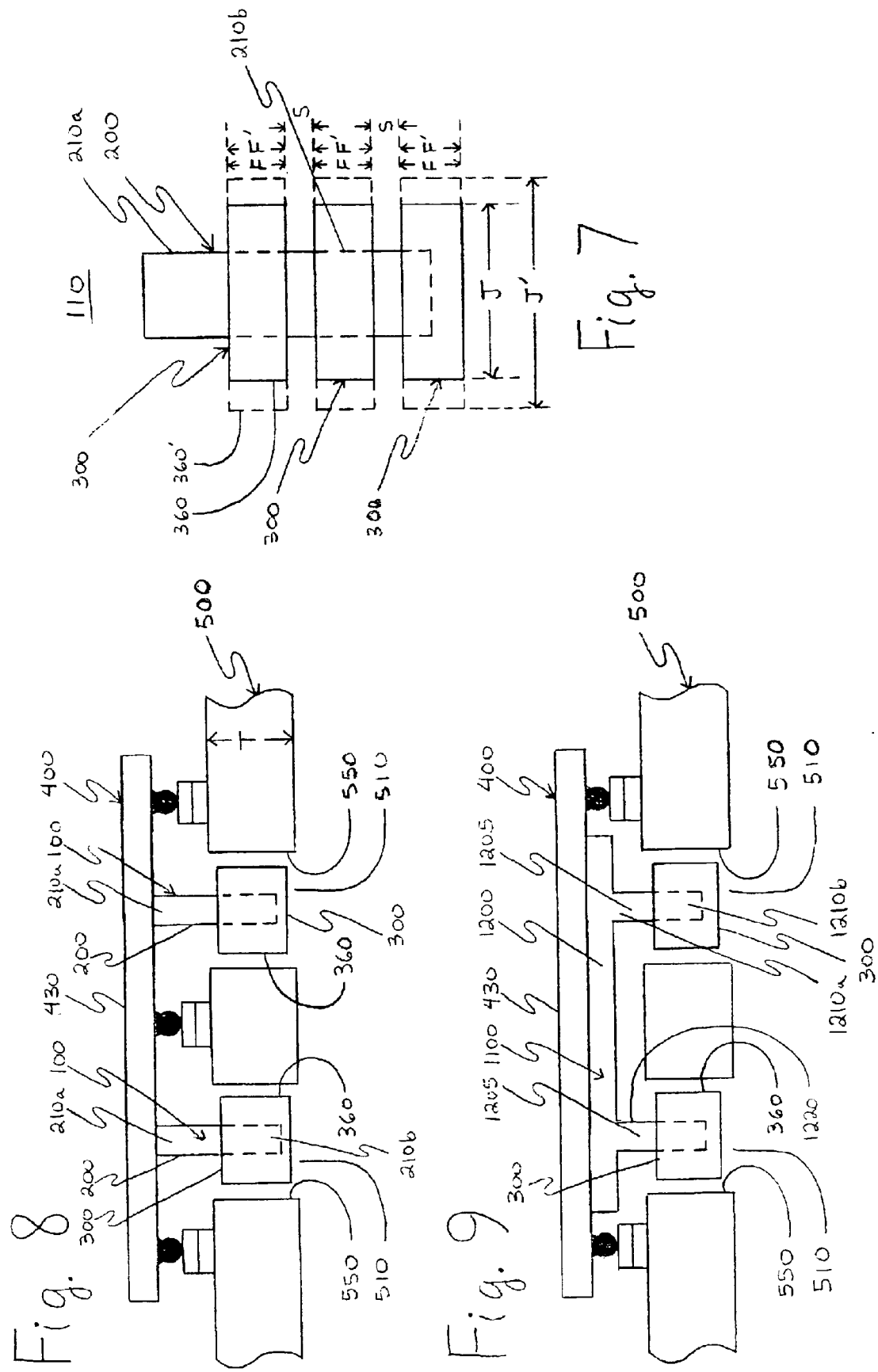

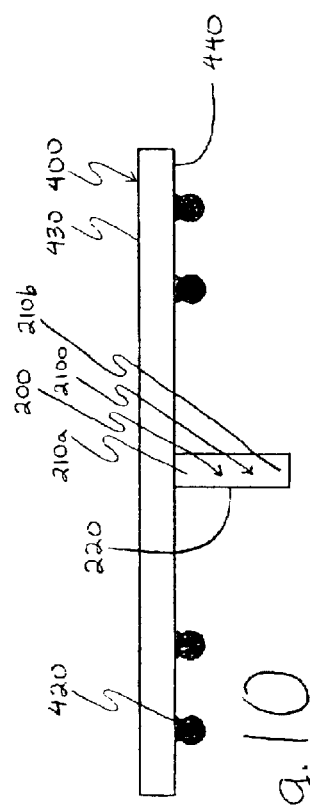
Fig. 10
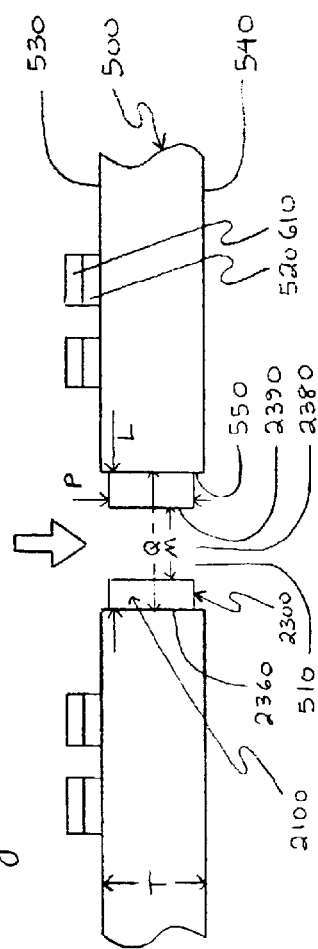
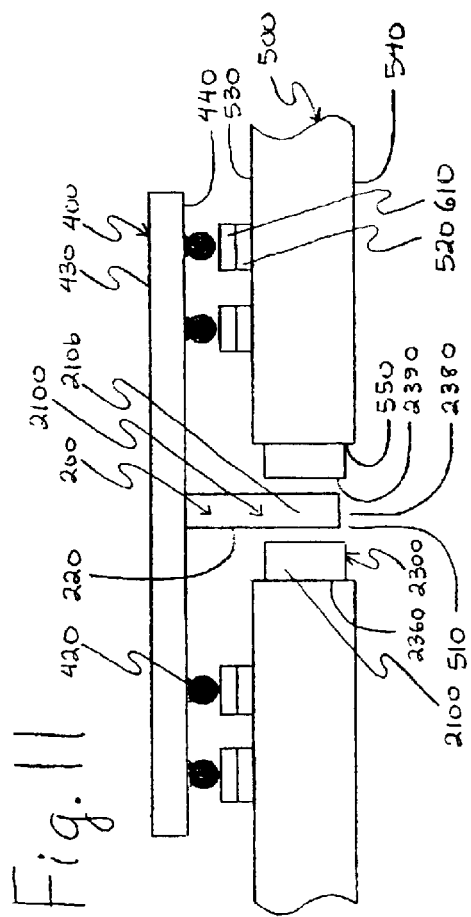
Fig. 11

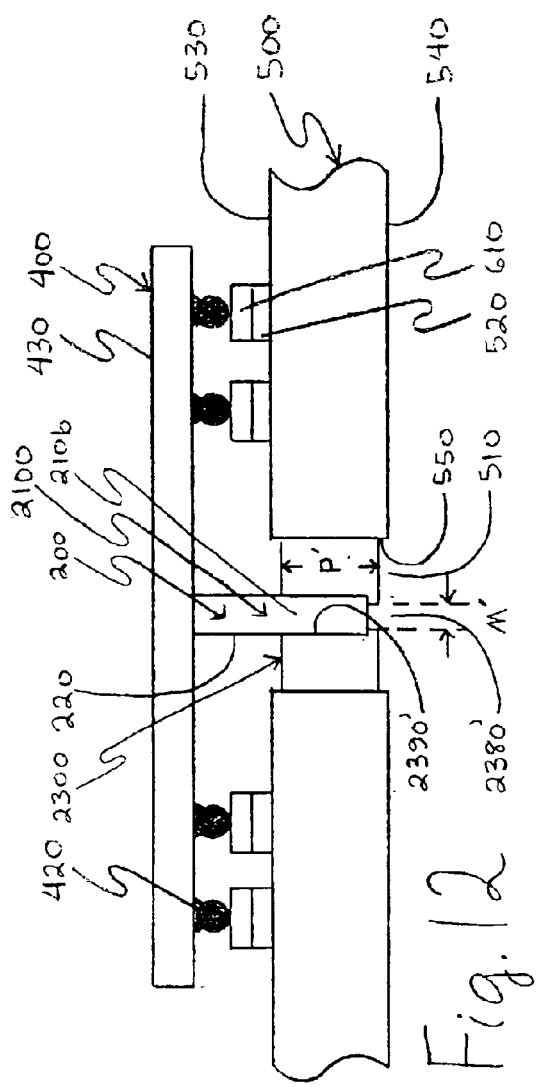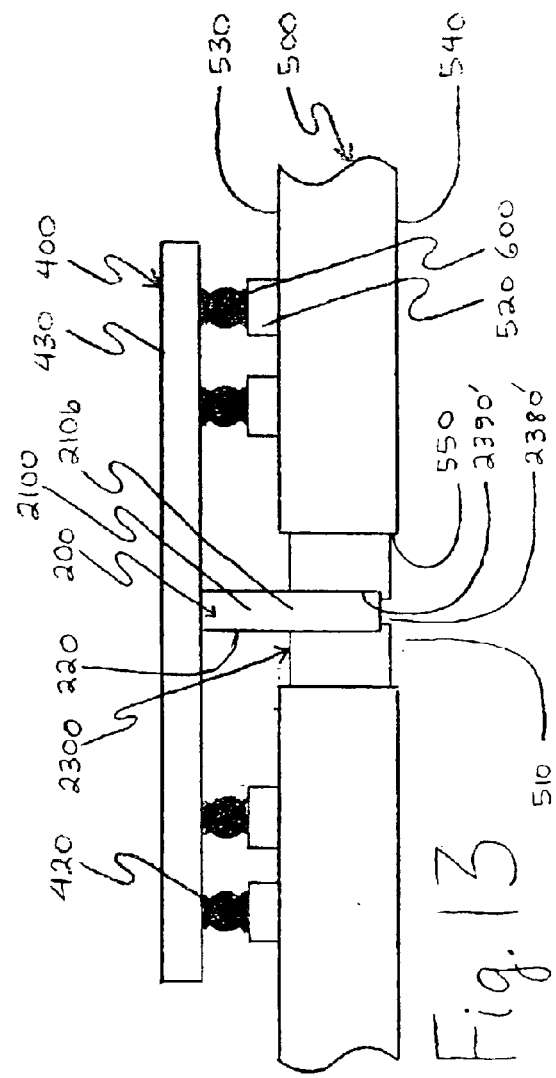

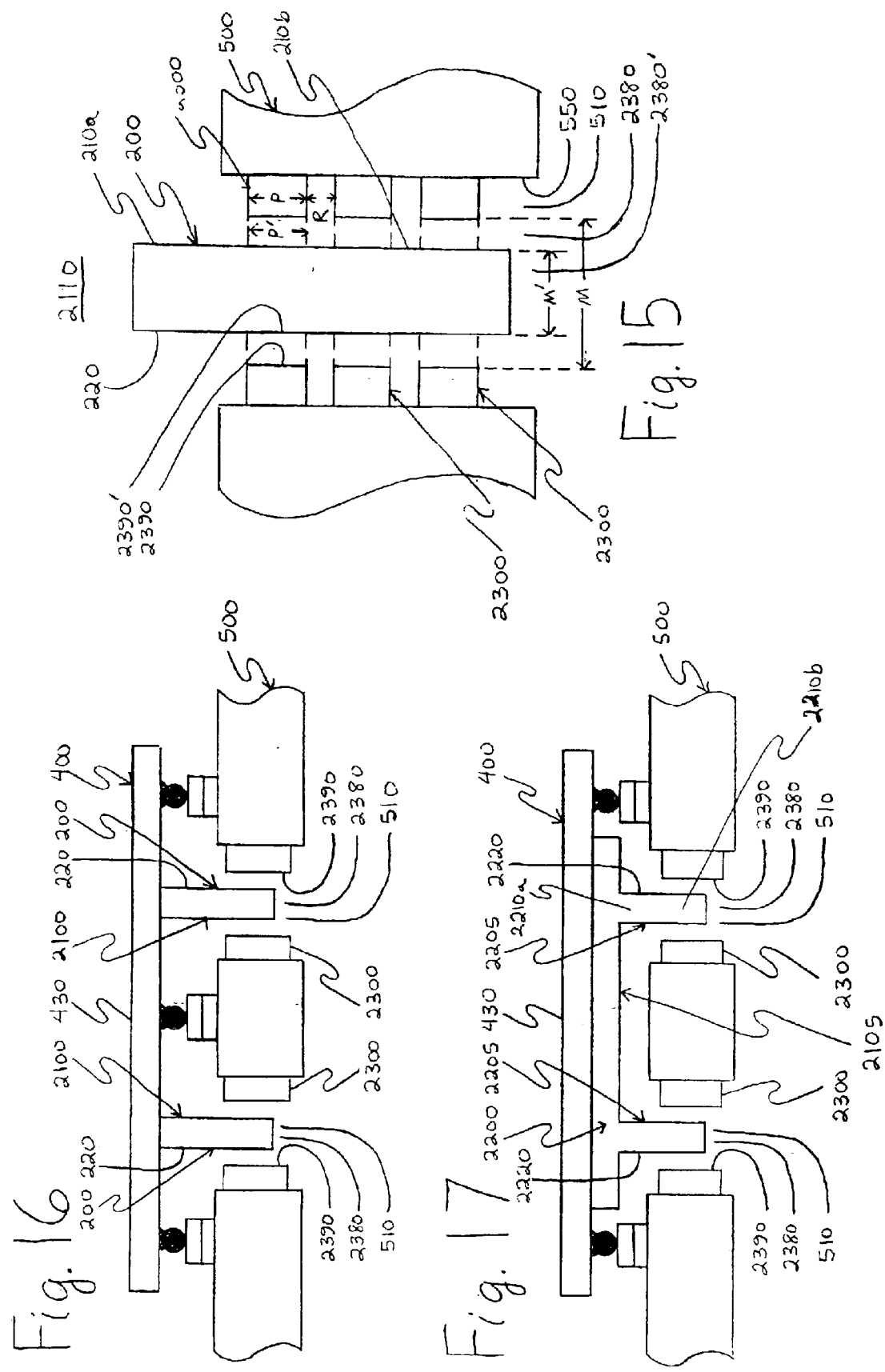

RETAINER FOR CIRCUIT BOARD ASSEMBLY AND METHOD FOR USING THE SAME

FIELD

Embodiments of the present invention relate generally to a circuit board assembly and, more particularly, to a heat-expandable retainer for a circuit board assembly.

BACKGROUND

Printed circuit boards (PCBs) generally comprise a composite of organic and inorganic materials with external and internal metal traces, permitting assembled electronic components to be mechanically supported and electrically connected. Electronic components are assembled on at least one of the outer metal layers of the typical printed circuit board. On a single-sided printed circuit board, for example, electronic components are assembled on only one of the outer metal layers, referred to as the primary side of the printed circuit board. The opposite side of such a printed circuit board is called the secondary side.

After the electrical components have been positioned on the primary side via, for example, a pick-and-place machine (not shown), the single-sided printed circuit board typically undergoes a single soldering stage. Alternatively, electronic components can be assembled on both the primary side and the secondary side of a double-sided printed circuit board. To assemble electrical components on both sides, double-sided printed circuit boards must typically undergo multiple soldering stages.

Today, a significant number of electrical components are surface mounted to printed circuit boards. Surface-mounted components are positioned on metal pads or lands, which are formed on the outer metal layers of the printed circuit board, by applying solder paste to the relevant lands before positioning the surface-mounted components. The solder paste liquefies during a manufacturing stage called solder reflow (or more simply reflow), and the surface tension of the liquefied solder enables the surface-mounted components to align with, and to couple with, the relevant lands on the printed circuit board. Thus, when the solder cools and solidifies, the surface-mounted components each are assembled on the printed circuit board.

To more efficiently utilize printed circuit board real estate, double-sided printed circuit boards are used with surface-mounted components assembled on both the primary side and the secondary side of the printed circuit board. The surface-mounted components first are assembled, i.e. positioned and reflowed, on an upward-facing side, such as the primary side, of the printed circuit board. The double-sided printed circuit board then is flipped over such that the opposite side, such as the secondary side, faces upwardly, and additional surface-mounted components are positioned on the secondary side. After the additional surface-mounted components have been positioned, the double-sided printed circuit board undergoes a second reflow stage to liquefy the solder on the upward-facing secondary side. During the second reflow stage, however, the entire double-sided printed circuit board is heated, and the solder on the primary side of the double-sided printed circuit board also liquefies with the surface-mounted components assembled on the primary side facing downwardly in opposition of gravity.

Unlike through-hole components, most surface-mounted components do not include any retaining devices, such as through-hole conductive pins and/or locating posts, to maintain component placement during the second reflow stage. Although adequate to maintain component placement on the upward-facing secondary side of the double-sided printed circuit board, the surface tension of the liquefied solder during the second reflow stage generally is insufficient to maintain component placement for heavier surface-mounted components previously assembled on the downward-facing primary side. Due to the effects of gravity, one or more of the surface-mounted components previously assembled on the downward-facing primary side can separate from or become misaligned with the relevant lands when the solder again liquefies during the second reflow stage.

To retain these larger surface-mounted components, adhesives presently are applied to the double-sided printed circuit board before the surface-mounted components are positioned. Automatic adhesive application, however, requires additional equipment, which must be purchased and maintained; whereas, manual application of the adhesive results in unpredictable quality and increased labor expenses.

BRIEF DESCRIPTION OF THE DRAWINGS

FIG. 1a is a side view of one embodiment of a heat-expandable retainer for printed circuit board assemblies;

FIG. 1b is a top view of the retainer of FIG. 1a.

FIG. 1c is a detailed side view of one embodiment of a retainer member for the retainer of FIG. 1a.

FIG. 1d is a detailed top view of the retainer member of FIG. 1c.

FIG. 1e is a detailed side view of one embodiment of a heat-expandable member for the retainer of FIG. 1a.

FIG. 1f is a detailed top view of the heat-expandable member of FIG. 1e.

FIG. 2 illustrates the retainer of FIG. 1a coupled with a component prior to placement onto a printed circuit board.

FIG. 3 illustrates the retainer of FIG. 2 after the component has been positioned onto the printed circuit board.

FIG. 4 illustrates the retainer of FIG. 3 during assembly of the component onto the printed circuit board.

FIG. 5 illustrates the retainer of FIG. 4 after the component has been assembled onto the printed circuit board.

FIG. 6a is a side view of an alternative heat-expandable retainer for printed circuit board assemblies in accordance with an embodiment of the present invention.

FIG. 6b is a top view of the retainer of FIG. 6a.

FIG. 6c is a detailed side view of one embodiment of a retainer member for the retainer of FIG. 6a.

FIG. 6d is a detailed top view of the retainer member of FIG. 6c.

FIG. 6e is a detailed side view of one embodiment of a heat-expandable member for the retainer of FIG. 6a.

FIG. 6f is a detailed top view of the heat-expandable member of FIG. 6e.

FIG. 7 illustrates an alternative heat-expandable retainer for printed circuit board assemblies in accordance with an embodiment of the present invention.

FIG. 8 illustrates an alternative embodiment of the retainer of FIG. 1a after the component has been positioned onto the printed circuit board.

FIG. 9 illustrates another alternative embodiment of the retainer of FIG. 1a after the component has been positioned onto the printed circuit board.

FIG. 10 is an illustration of another alternative heat-expandable retainer for printed circuit board assemblies in accordance with an embodiment of the present invention.

FIG. 11 illustrates the retainer of FIG. 10 after the component has been positioned onto the printed circuit board.

FIG. 12 illustrates the retainer of FIG. 11 during assembly of the component onto the printed circuit board.

FIG. 13 illustrates the retainer of FIG. 12 after the component has been assembled onto the printed circuit board.

FIG. 14b is a top view of the unexpanded heat-expandable member of FIG. 14a.

FIG. 15 illustrates an alternative embodiment of a heat-expandable retainer for printed circuit board assemblies in accordance with an embodiment of the present invention.

FIG. 16 illustrates an alternative embodiment of the retainer of FIG. 10 after the component has been positioned onto the printed circuit board.

FIG. 17 illustrates another alternative embodiment of the retainer of FIG. 10 after the component has been positioned onto the printed circuit board.

DETAILED DESCRIPTION

Figure 14B:
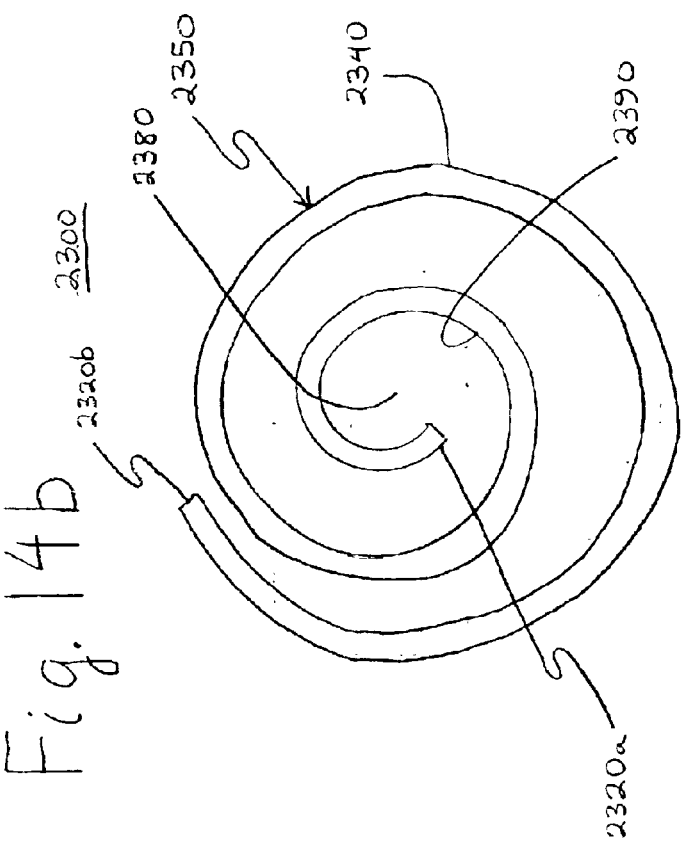

A heat-expandable retainer for circuit board assemblies and method for using the same are described. Reference will now be made in detail to the embodiments of the invention, examples of which are illustrated in the accompanying drawings. While the invention will be described in conjunction with numerous embodiments, it will be understood that they are not intended to limit the invention to these embodiments. On the contrary, embodiments of the invention are intended to cover alternatives, modifications and equivalents, which may be included within the spirit and scope of the invention as defined by the claims.

Single Retainer

FIG. 1a is a side view of one embodiment of a heat-expandable retainer 100 for printed circuit board assemblies. The retainer 100 comprises a retainer member 200 and a heat-expandable member 300. The retainer member 200 can be manufactured in any size and shape, such as a cylindrical body as illustrated in FIGS. 1c and 1d, and by any manufacturing process, such as stamping or molding.

As illustrated, the retainer member 200 has a length A and a cross-sectional profile B, each of which can be of any suitable dimension. The retainer member 200 has a periphery 220 and includes a proximal end region 210a and an oppositely disposed distal end region 210b. In one embodiment, the uniform cross-sectional profile B is substantially uniform. In an alternative embodiment, a cross-sectional profile of the proximal end region 210a can be greater than, equal to, or less than a cross-sectional profile of the distal end region 210b.

The retainer member 200 is formed from a retainer material, which can be any type of material, such as a plastic, a ceramic, or a metal. In one embodiment, the retainer material is a liquid crystal polymer (LCP) plastic. The retainer material remains chemically and/or functionally stable when exposed to temperatures that are much higher than a melting point of solder or a typical solder reflow temperature range used in surface mount (SMT) manufacturing. The solder reflow temperature range is between approximately 180° C. and 240° C.

Turning to FIGS. 1e and 1f, the heat-expandable member 300 transitions from an unexpanded state to an expanded state when exposed to an activation temperature. In one embodiment, the activation temperature is greater than or substantially equal to the typical solder reflow temperatures (e.g. 180° C.–200° C.). In alternative embodiments, depending upon the particular application, the activation temperature can be less than the typical solder reflow temperatures.

In the unexpanded state, the heat-expandable member 300 has an external surface 360 that includes an unexpanded width F and an unexpanded cross-sectional profile J, each of which can be of any suitable dimension. The heat-expandable member 300 can be manufactured from any type of un-activated, or unexpanded, heat-expandable material and by any manner. The heat-expandable material remains chemically and/or functionally stable when exposed to temperatures that are much higher than the typical solder reflow temperatures. The heat-expandable member 300 maintains the unexpanded cross-sectional profile J as long as an ambient temperature surrounding the heat-expandable member 300 remains below the activation temperature.

The heat expandable member 300 expands when the ambient temperature is greater than or substantially equal to the activation temperature. Upon being activated, the heat-expandable member 300 enters the expanded state. In the expanded state, the heat-expandable member 300 has an expanded external surface 360' an expanded width F' and an expanded cross-sectional profile J'. Each of these can be predetermined to be of any suitable dimension. In one embodiment, the unexpanded external surface 360 expands substantially uniformly to produce the unexpanded external surface 360' when exposed to the activation temperature. Accordingly, the expanded cross-sectional profile J' is larger than the unexpanded cross-sectional profile J.

In one embodiment, the unexpanded width F and the expanded width F' are substantially equal. In an alternative embodiment, the expanded width F' can be greater than or less than the unexpanded width F. In one embodiment, the expansion of the heat-expandable material is substantially irreversible. For example, when the ambient temperature subsequently falls below the activation temperature, the expanded heat-expandable member 300 remains in the expanded state. Accordingly, the heat-expandable member 300 approximately maintains the expanded cross-sectional profile J'.

Returning to FIGS. 1a and 1b, the heat-expandable member 300 can be secured with the retainer member 200 in any manner such as an adhesive, a clamp, and/or a fastener. The heat-expandable member 300 includes one or more internal surfaces 390 (shown in FIG. 1e), which form a channel 380 (shown in FIG. 1e).

The channel 380 receives the distal end region 210b of the retainer member 200. For example, the channel 380 can be preformed in the heat-expandable material, such as when the heat-expandable member 300 is shaped as a tube or a toroid, or the channel 380 can be formed in the heat-expandable material by the distal end region 210b as the distal end region 210b is being received. In one embodiment, the channel 380 can be formed partially, as illustrated in FIG. 1e. In an alternative embodiment, the channel 380 can run completely through the heat-expandable member 300 and have a cross-sectional profile N. The cross-sectional profile N can be of any suitable dimension and is less than or substantially equal to the cross-sectional profile B of the retainer member 200.

Once disposed within the channel 380, the distal end region 210b can be inhibited from being removed from the channel 380 in any manner, such as by frictionally or adhesively engaging the internal surfaces 390. The heat-expandable material is substantially uniformly disposed about the periphery 220.

If desired, the heat-expandable member 300 can be manufactured on the retainer member 200 by any manner, such as by molding.

Turning to FIG. 2, the retainer 100, in operation, is coupled with a component 400 via the proximal end region 210a of the retainer member 200. The component 400 may be any type of electrical and/or electronic component, such as an integrated circuit die, a socket, or a connector. In one embodiment, the component 400 is a surface-mounted component manufactured in, for example, a ball-grid array (BGA), a quad flat pack (QFP), or a thin small outline package (TSOP). The component 400 may alternatively be any type of package, including through-hole packages.

The component 400 includes one or more electrical connections or contacts 420, such as leads and/or pads, which are electrically isolated and supported by a component package 430. The component package 430 can be formed from any type of electronic packaging material, such as a plastic, a ceramic, or a metal. The electrical connections 420 each couple the component 400 with one or more relevant mounting surfaces 520, such as solder pads or lands, on one side of a printed circuit board 500.

In one embodiment, the retainer member 200 is centrally positioned such that a mass or size of the component 400 is equally distributed about the retainer 100. In an alternative embodiment, the retainer member 200 can be coupled with, or formed on, the component package 430 in any manner including via an adhesive, a clamp, and/or a fastener. The component package 430 and the retainer member 200 can be formed from the same material and/or can be a single unit. The retainer member 200 can be coupled with the component package 430 at any time, such as before the component 400 has been assembled onto the printed circuit board 500, during a separate manufacturing stage, or during pre-assembly preparation of the component 400.

The printed circuit board 500 includes at least one inner surface 550 that defines an opening 510. The opening 510 extends completely, as illustrated in FIG. 2, or partially through the printed circuit board 500 and receives the heat-expandable member 300. Although the opening 510 is shown as a non-plated through-hole, the opening 510 can be any type of opening, such as a via and/or a plated through-hole. The opening 510 has a cross-sectional profile L, which can be of any suitable dimension.

In one embodiment, the cross-sectioned profile L is greater than the unexpanded cross-sectional profile J (shown in FIG. 1e) and less than or substantially equal to the expanded cross-sectional profile J' (shown in FIG. 1e). The cross-sectional profile L exceeds the unexpanded cross-sectional profile J by approximately 0.020 inches to facilitate insertion of the heat-expandable member 300 without producing too large of a gap 560 (shown in FIG. 3) between the heat-expandable member 300 and the inner surface 550.

The component 400 is positioned onto the relevant mounting surfaces 520 on one side, such as the primary side 530 as shown in FIG. 3. The primary side 530 is a side of the printed circuit board 500 that is first populated and reflowed. The secondary side 540 is opposite the primary side 530 and may be populated and reflowed after the primary side 530. The component 400 can be positioned by any manner. Additional components (not shown) also can be positioned onto one or more additional relevant mounting surfaces (not shown) on the primary side 530 by any manner known in the art.

The component 400 may be positioned onto the primary side 530 in the same manner that is used to position the additional components. If solder reflow is to be used to assemble the component 400 and the additional components, solder paste 610 is applied to each relevant mounting surface 520 for the component 400 and each additional relevant mounting surface for the additional components prior to placement. It will be appreciated that the component 400 can also be positioned onto the secondary side 540.

When the component 400 is properly positioned onto the printed circuit board 500, the heat-expandable member 300 is in axial alignment with the opening 510. In the unexpanded state, heat expandable member 300 is received by the opening 510. The heat-expandable member 300 can be completely disposed within, as shown in FIG. 3, or extended from the opening 510 adjacent to the primary side 530 and/or the secondary side 540.

When disposed completely within the opening 510, the width F (shown in FIG. 1e) of the heat-expandable member 300 is less than or equal to a thickness T of the printed circuit board 500. The thickness T can be any thickness. In different embodiments, the thickness T may be a printed circuit board thickness of 0.062, 0.050, 0.040, or 0.012 inches. If the width F exceeds the thickness T, the heat-expandable member 300 can extend from the opening 510 adjacent to the primary side 530 and/or the secondary side 540.

In one embodiment, the heat-expandable member 300 does not extend from the opening 510 adjacent to the secondary side 540. The heat-expandable member 300 is recessed within the opening 510 adjacent to the secondary side 540 to inhibit subsequent interference between the retainer 100 and a stencil (not shown) for applying solder paste to the secondary side 540.

Once positioned onto the primary side 530, the component 400 and the additional components, if any, are held in place via the solder paste 610 and/or gravity. The components are assembled onto the primary side 530. The component 400 and the additional components can be assembled via any manner known in the art, including wave soldering, hand soldering, convection reflow, and/or infrared (IR) reflow.

In one embodiment, during convection reflow, the printed circuit board 500, the component 400, the retainer 100, and the additional components begin to heat. The ambient temperature surrounding the printed circuit board 500 increases from room temperature and approaches the typical solder reflow temperatures at which the solder paste 610 can begin to liquefy. As the solder paste 610 liquefies, a surface tension of the liquefied solder paste 610 enables the electrical connections 420 of the component 400 to align and couple with the relevant mounting surfaces 520.

Since the heat-expandable member 300 is formed from the heat-expandable material with the activation temperature greater than or equal to the typical solder reflow temperatures, the heat-expandable member 300 activates. As the ambient temperature reaches and/or exceeds the typical solder reflow temperatures, the heat-expandable member 300 enters the expanded state as shown in FIG. 4. Since the expanded cross-sectional profile J' of the heat-expandable member 300 is greater than or equal to the cross-sectional profile L of the opening 510, the expanded external surface 360' engages the inner surface 550 as or after the solder paste 610 liquefies.

To permit the surface tension of the liquefied solder paste 610 to guide the alignment of the component 400 with the relevant mounting surfaces 520, the heat-expandable member 300 expands substantially uniformly from the periphery 220 of the retainer member 200. Thereby, the proper position of the component 400 on the relevant mounting surfaces 520 is maintained.

As the heat-expandable material continues to expand, the expanded external surface 360' contacts and presses against the inner surface 550.

Once the component 400 is aligned with the relevant mounting surfaces 520, the liquefied solder paste 610 forms solder connections 600 as shown in FIG. 5. The solder connections 600 couple the electrical connections 420 with the relevant mounting surfaces 520. After convection reflow, the solder connections 600 cool and solidify, and the component 400 is properly assembled onto the printed circuit board 500. As the ambient temperature decreases below the activation temperature, the retainer 100 also cools. The heat-expandable member 300 maintains the expanded cross-sectional profile J' and continues to engage the inner surface 550 because the expansion of the heat-expandable material is irreversible.

After the component 400 and the additional components are assembled onto the primary side 530, the printed circuit board 500 can be inverted to facilitate the positioning of one or more other components (not shown) onto the secondary side 540. The other components are each positioned onto one or more other relevant mounting surfaces (not shown) on the secondary side 540 by any manner known in the art. For example, solder paste (not shown) can be applied to the other relevant mounting surfaces, and the other components can be positioned onto the other relevant mounting surfaces and held in place by the solder paste and/or gravity.

Once positioned, the other components are assembled onto the secondary side 540 by a second convection reflow stage that is similar to the convection reflow stage. During the second convection reflow stage, the printed circuit board 500, the inverted component 400, the retainer 100, and the other components begin to heat. To liquefy the solder paste associated with the other components, the ambient temperature surrounding the printed circuit board 500 approaches the typical solder reflow temperature at which some or all of the solder connections 600 of the inverted component 400 also can soften and/or liquefy.

Since the retainer material and the heat-expandable material can both withstand decomposition and/or remain functionally stable at temperatures exceeding the typical solder reflow temperatures, the retainer 100 remains functionally stable during the second convection reflow stage. The retainer material and the heat-expandable material inhibit the retainer 100 from deforming or softening due to heat exposure, maintaining the engagement between the expanded external surface 360' and the inner surface 550 as some or all of the solder connections 600 soften and/or liquefy.

As the solder connections 600 liquefy during the second convection reflow stage, the inverted component 400 is supported and coupled with the printed circuit board 500 via the retainer 100. Since the expanded heat-expandable member 300 maintains the expanded cross-sectional profile J' and continues to engage the inner surface 550 after the first convection reflow, the retainer 100 resists being removed from the opening 510 as the solder connections 600 liquefy. The inverted component 400 is thereby inhibited from separating from the printed circuit board 500 and/or from becoming misaligned with the relevant mounting surfaces 520. Thus, after the second convection reflow stage, the other components are assembled onto the secondary side 540. The inverted component 400, supported by the retainer 100 during the second reflow stage, remains properly assembled.

In one embodiment, as was previously discussed, the retainer 100 can be coupled with the component package 430 after the component 400 has been assembled and inverted. In one embodiment, when the retainer member 200 is coupled with the assembled component 400, the heat-expandable member 300 is in the unexpanded state substantially disposed within and axially aligned with the opening 510.

In one embodiment, unlike the prior discussion, the heat-expandable member 300 is not activated while the component 400 is being assembled during the first convection reflow stage. Instead, the heat-expandable member 300 activates and expands as the ambient temperature surrounding the printed circuit board 500 approaches the typical solder reflow temperatures during the second convection reflow stage.

The heat-expandable member is formed from the heat-expandable material with the activation temperature that is less than or equal to the typical solder reflow temperatures. Accordingly, the heat-expandable member 300 expands substantially uniformly from the periphery 220 of the retainer member 200 to enter the expanded state before or as the solder connections 600 associated with the assembled component 400 soften and/or liquefy. The expanded external surface 360' then contacts and engages the inner surface 550, supporting the assembled component 400 during the second convection reflow stage in the manner discussed in more detail above.

In one embodiment, the heat-expandable-material can be a shape memory alloy (SMA) or material. In one embodiment, the shape memory alloy is a one-way trainable shape memory alloy. For example, shape memory alloys with activation temperatures that are greater than or equal to the typical solder reflow temperatures include alloys of copper-aluminum-nickel and titanium-nickel-hafnium, produced by the TiNi Alloy Company of San Leandro, Calif. These can have activation temperatures up to 450° C. The nickel titanium alloys B and BH, which are produced by Memory Corporation in Bethel, Conn. are examples of suitable shape memory alloys and activate at temperatures between approximately 45° C. and 80° C. and between approximately 80° C. and 120° C. respectively. These temperatures are less than the typical solder reflow temperatures.

Shape memory alloys are a unique class of metal alloys that, once trained remember a pre-selected shape and can return to the pre-selected shape even if subsequently reshaped. To be trained to remember a first pre-selected shape, the shape memory alloy is heated at or above a training, or austenite, temperature to place the shape memory alloy in an austenite phase. In the austenite phase, the shape memory alloy can be formed in the first pre-selected shape.

Once formed, it is permitted to cool to a martensite finish temperature, and the shape memory alloy enters a martensite phase. The martensite finish temperature can be any temperature that is less than the training temperature and may approximate room temperature. Upon entering the martensite phase, the shape memory alloy has been trained to remember the first pre-selected shape. When reformed into a second pre-selected shape, the shape memory alloy in the martensite phase maintains the second pre-selected shape.

If the shape memory alloy is subsequently reheated to an activation temperature, it automatically returns to the first pre-selected shape. The activation temperature can be any temperature that is greater than the martensite finish temperature and may approximately equal the training temperature. Once the first pre-selected shape has been recovered, the shape memory alloy maintains the first pre-selected shape.

If the heat-expandable material is the shape memory alloy, the heat-expandable material is formed as a thin substantially rectangular sheet as illustrated in FIGS. 6e and 6f. The shape memory alloy has an internal surface 330 and an oppositely disposed external surface 340. The shape memory alloy has a length E, a width F, and a thickness G, each of which can be of any suitable dimension.

In one embodiment, the thickness G of the shape memory alloy is between approximately 0.003 inches and 0.006 inches. The shape memory alloy also includes a proximal end region 310a and an oppositely disposed distal end region 310b. The proximal end region 310a and the distal end region 310b each can be formed with any size and shape. As shown in FIG. 6e, the proximal end region 310a has a length H and a width I, each of which can be of any suitable dimension. The width I can be less than, greater than, or equal to the width F of the shape memory alloy. In one embodiment, a transition 310c between the proximal end region 310 and the distal region 310b is substantially gradual or tapered, as illustrated in FIG. 6e. In an alternative embodiment, the transition 310c can be of any form.

Turning to FIGS. 6a and 6b, the distal end region 310b of the shape memory alloy can be manufactured in any shape such as in the shape of an unexpanded coil 350. The unexpanded coil 350 is substantially cylindrical. For example, after being trained to remember the shape of an expanded coil (not shown) with an expanded cross-sectional profile (not shown), the distal end region 310b can be reshaped as the unexpanded coil 350 with an unexpanded cross-sectional profile J. The expanded coil and the unexpanded coil 350 can be manufactured in any manner known in the art. The expanded cross-sectional profile and the unexpanded cross-sectional profile J can be of any suitable dimension such that the expanded cross-sectional profile is greater than the unexpanded cross-sectional profile J.

To train the distal end region 310b to remember the shape of the expanded coil, the distal end region 310b can be heated at or above a training temperature to place the shape memory alloy in the austenite phase. In one embodiment, the training temperature is substantially equal to the activation temperature of the shape memory alloy. In an alternative embodiment, the training temperature can be any temperature that is greater than or less than the activation temperature and is determined by the characteristics, or properties, of the particular shape memory alloy.

The distal end region 310b is then wrapped around the proximal end region 310a in any manner, such as clockwise or counter-clockwise. The external surface 340 is disposed away from the central proximal end region 310a. In one embodiment, the distal end region 310b completes at least one revolution around the central proximal end region 310a. In an alternative embodiment, the expanded coil can comprise any number of complete or partial revolutions and has a spacing K between consecutive revolutions. The spacing K can vary or be uniform between consecutive revolutions of the expanded coil. In one embodiment, the coil is substantially cylindrical. An outer revolution 365 of the expanded coil is substantially uniformly disposed about the proximal end region 310a by tapering a distal end 320b of the distal end region 310b toward the external surface 340 associated with an adjacent inner revolution of the expanded coil.

When cooled to a martensite finish temperature, the shape memory alloy returns to the martensite phase. The shape memory alloy maintains the shape of the expanded coil. The martensite finish temperature is a temperature that is less than the training temperature and is substantially equal to room temperature.

Upon entering the martensite phase, the distal end region 310b can be reshaped as the unexpanded coil 350, which is substantially cylindrical. Being manufactured at the martensite finish temperature, the unexpanded coil 350 can be formed around the central proximal end region 310a by any manner known in the art. In one embodiment, the unexpanded coil 350 is wrapped in a substantially similar direction as the expanded coil. Analogously to the expanded coil, the unexpanded coil 350 completes at least one revolution around the central proximal end region 310a with the external surface 340 being disposed away from the central proximal end region 310a.

In one embodiment, the unexpanded coil 350 is formed from the expanded coil by increasing the number of revolutions about the central proximal end region 310a and/or decreasing the spacing K between consecutive revolutions. As was discussed in more detail above, the outer revolution 365 of the unexpanded coil 350 is substantially uniformly disposed about the proximal end region 310a. Once formed, the distal end region 310b retains the shape of the unexpanded coil 350 until the shape memory alloy is exposed to the activation temperature.

The retainer member 200 shown in FIGS. 6c and 6d can be produced in the manner described in more detail above with respect to FIGS. 1c and 1d. In addition, the distal end region 210b includes one or more internal surfaces 240 that define a substantially radial channel 230. The radial channel 230 can be formed with any shape and size. For example, the radial channel 230 can have a length C and a width D, each of which can be of any suitable dimension. In one embodiment, the radial channel 230 can be formed completely, as shown in FIG. 6c. The radial channel 230 can also be formed partially through the cross-sectional profile B and can extend axially through the distal end region 210b. Stated somewhat differently, the radial channel 230 can be completely enclosed by the retainer material or partially enclosed, forming a longitudinal slot (not shown) in the retainer member 200.

Returning to FIGS. 6a and 6b, the heat-expandable member 300 can be coupled with the retainer member 200 in any manner known in the art as was described in more detail above with respect to FIGS. 1a and 1b. The proximal end region 310a is received by the radial channel 230. The length H of the proximal end region 310a can be greater than, less than, or equal to a diameter of the cross-sectional profile B of the retainer member 200 to permit the proximal end 320a to extend through (shown in FIGS. 6a and 6b) or to be disposed within the radial channel 230. Similarly, the width I of the proximal end region 310a is less than the length C of the radial channel 230. The thickness G is less than the width D of the radial channel 230.

Once disposed within the radial channel 230, the proximal end region 310a can be inhibited from being removed from radial channel 230 in any manner known in the art. For example, the proximal end region 310a can frictionally or adhesively engage the internal surfaces 240. In an alternative embodiment, as illustrated in FIG. 6b, a thickness (not shown) of the proximal end 320a can be expanded to be greater than or equal to the width D such as by bending the proximal end 320a relative to the proximal end region 310a.

The retainer member 200 also can be manufactured on the proximal end region 310a by any manner known in the art, such as molding.

The shape memory alloy of the distal end region 310b can be trained to remember the shape of the expanded coil at any time, including before or after being coupled with the retainer member 200. For example, the distal end region 310b can be preformed as the expanded coil (described in more detail above) before being coupled with the retainer member 200.

After being trained to remember the shape of the expanded coil, the distal end region 310b can be unfurled. The proximal end region 310a can be coupled with the retainer member 200 in the manner described above with respect to FIGS. 6a and 6b. The retainer member 200 also can be coupled with the distal end region 310b without unfurling the preformed expanded coil. For example, the proximal end region 310a can be offset to form a central passage (not shown) in the preformed expanded coil. Accordingly, the retainer member 200 can be received within the central passage and coupled with the proximal end region 310a in the manner described above.

The coupling between the retainer member 200 and the preformed expanded coil can be facilitated if the radial channel 230 extends axially through the distal end region 210b and/or the cross-sectional profile B tapers upon approaching the distal end region 210b. Once coupled with the retainer member 200, the distal end region 310b can be shaped into the unexpanded coil 350. That shape will be maintained until the retainer 100 is exposed to the activation temperature.

The proximal end region 310a also can be coupled with the retainer member 200 before the distal end region 310b has been trained to remember the shape of the expanded coil. For example, the proximal end region 310a can be coupled with the retainer member 200 as was described in more detail above. Then the distal end region 310b and the retainer member 200 are exposed to the training temperature.

The retainer member is formed from retainer material that remains chemically and/or functionally stable when exposed to temperatures that exceed the typical solder reflow temperatures. Accordingly, the retainer member 200 withstands exposure to the training temperature. While heated to the training temperature, the distal end region 310b can be wrapped around the periphery 220 of the retainer member 200 in any manner to form the expanded coil.

Once formed, the distal end region 310b and the retainer member 200 are cooled such that the distal end region 310b is trained to "remember" the shape of the expanded coil. The distal end region 310b then can be shaped into the unexpanded coil 350. That shape will be maintained until the retainer 100 is subsequently exposed to the activation temperature.

The retainer 100 is coupled with a component 400, in the manner described above with respect to FIGS. 2 and 3. The component 400 is positioned on a printed circuit board 500 with at least one inner surface 550 defining an opening 510 with a cross-sectional profile L. In one embodiment, the cross-sectional profile L is sized less than or equal to the expanded cross-sectional profile of the expanded coil. The cross-sectional profile L is sized greater than the unexpanded cross-sectional profile J of the unexpanded coil 350. This is so that the unexpanded coil 350 can be received by the opening 510.

During assembly, the ambient temperature surrounding the printed circuit board 500 approaches the typical solder reflow temperature. The distal end region 310b heats up nearing the activation temperature. Upon reaching the activation temperature, the distal end region 310b begins to recover the shape of the expanded coil in the manner that was discussed in more detail above. It unwinds, expanding substantially uniformly from the shape of the unexpanded coil 350.

As the distal end region 310b recovers the shape of the expanded coil, the external surface 340 extends toward and contacts the inner surface 550. This is described above with respect to the expanded external surface 360. The cross-sectional profile L is less than or equal to the expanded cross-sectional profile of the expanded coil. Upon contacting the inner surface 550, the external surface 340 can continue to expand. The external surface 340 presses against and engages the inner surface 550 until the shape of the expanded coil is substantially recovered.

To inhibit the component 400 from rotating as the distal end region 310b unwinds, a second retainer member (not shown) can be coupled with the component package 430 in one embodiment. The second retainer member can be formed with any dimension and in any manner and can be disposed in a second opening (not shown) formed in the printed circuit board 500.

After assembly of the component 400, the ambient temperature decreases below the activation temperature. Although the retainer 100 also cools, the distal end region 310b maintains the expanded cross-sectional profile of the expanded coil. The external surface 340 continues to engage the inner surface 550 since the recovery of the expanded coil is irreversible.

After the component 400 has been assembled, the printed circuit board 500 can be inverted and subsequently reflowed in the manner described above. Since the retainer material and the shape memory alloy each can withstand decomposition and/or remain functionally stable at temperatures exceeding the typical solder reflow temperatures, the retainer 100 remains functionally stable during the subsequent reflow stage.

As solder connections 600 associated with the inverted component 400 begin to liquefy during the subsequent reflow stage, the inverted component 400 is supported and coupled with the inverted printed circuit board 500 via the retainer 100. Thereby, the inverted component 400 is inhibited from separating from and/or becoming misaligned with the printed circuit board 500. Being supported by the retainer 100 during the second reflow stage, the inverted component 400 remains properly assembled on the printed circuit board 500 after the subsequent reflow stage.

Returning to FIG. 3, the unexpanded external surface 360 also can be treated to enhance the engagement with the inner surface 550. The engagement can be enhanced by any manner known in the art, such as by applying an adhesive to the unexpanded external surface 360 and/or the inner surface 550. For example, the unexpanded external surface 360 can be roughened by any process, such as scoring. In another embodiment of the invention, a conforming material (not shown), such as a spongy material, can be disposed on the unexpanded external surface 360.

In addition, the inner surface 550 can be treated, such as by roughening, to enhance the engagement with the unexpanded external surface 360. The inner surface 550 can be roughened by any manner known in the art such as scoring or notching. A conforming material (not shown) also can be coupled with the inner surface 550 to engage the unexpanded external surface 360.

A sleeve (not shown) with an internal surface (not shown) that is roughened or coupled with a conforming material can be disposed within the opening 510 and coupled with the inner surface 550. The sleeve can be formed from a rough or conforming material. In another embodiment, the internal surface of the sleeve can be roughened or coupled with the conforming material in any manner known in the art.

FIG. 7 is an illustration of a retainer 10 that includes a retainer member 200 and heat-expandable members 300. The heat-expandable members 300 are coupled with the retainer member 200 and transition from an unexpanded state to an expanded state when exposed to an activation temperature. The activation temperature is greater than or substantially equal to the typical solder reflow temperatures.

As described in more detail above, each heat-expandable member 300 in the unexpanded state has an unexpanded cross-sectional profile J, an unexpanded width F, and an unexpanded external surface 360. Each heat-expandable member 300 in the expanded state has an expanded cross-sectional profile J' which includes an expanded width F' and an expanded external surface 360'. It should be noted that the dimensions, the heat-expandable materials, and the activation temperatures each can vary or be substantially uniform among the heat-expandable members 300.

The retainer 110 is coupled with a component 400 (shown in FIG. 3), which is, positioned on a printed circuit board 500 (shown in FIG. 3). Each heat-expandable member 300, in the unexpanded state, is disposed within an opening 510 (shown in FIG. 3) formed in the printed circuit board 500. In one embodiment, each unexpanded width F and expanded width F' is sufficiently large, and each spacing S between adjacent heat-expandable members 300 is sufficiently small, to inhibit the relevant heat-expandable member 300 from inclining relative to a longitudinal axis of the retainer member 200.

Upon being activated and entering the expanded state, each expanded external surface 360' engages an inner surface 550 (shown in FIG. 3) that defines the opening 510. Some or all of the heat-expandable members 300 are formed as an unexpanded coil 350 in the manner described above with respect to FIGS. 6a and 6b. Some of the unexpanded coils 350 can be wrapped clockwise about the retainer member 200. The other unexpanded coils 350 can be wrapped counter-clockwise to inhibit the component 400 from rotating during expansion. It should be noted, however, that each of the unexpanded coils 350 can be wrapped the in same direction.

Multiple Retainers

Although a single retainer 100 has been previously shown and described as being coupled with a component 400, many retainers 100 may be used to adequately support larger and/or heavier components 400 as illustrated in FIG. 8. In one embodiment, the retainers 100 are non-centrally disposed on a component package 430 of the component 400. In an alternative embodiment, the retainers 100 may be arranged in any manner, such that the mass of the component 400 is equally distributed among the retainers 100. For example, if the component package 430 is rectangular, one retainer 100 can extend from each corner of the component package 430.

Each retainer 100 includes a retainer member 200 and at least one heat-expandable member 300. Each retainer member 200 is produced in the manner described above with respect to the retainer member 200 and can be formed with differing and/or uniform dimensions, heat-expandable materials, and activation temperatures. Each of the heat-expandable members 300 is coupled with the relevant retainer member 200 and transitioned from an unexpanded state to an expanded state when exposed to an activation temperature.

If some or all of the heat-expandable members 300 are formed as an unexpanded coil 350 as was discussed in more detail above with respect to FIGS. 6a and 6b, some of the unexpanded coils 350 can be wrapped clockwise about the relevant retainer members 200. The other unexpanded coils 350 can be wrapped counter-clockwise to inhibit the component 400 from rotating during expansion.

The component 400 is positioned and assembled onto a printed circuit board 500, which forms at least one opening 510 with respect to the printed circuit board 500. When the component 400 is properly positioned onto the printed circuit board 500, the heat-expandable members 300 are in axial alignment with the relevant openings 510. In the unexpanded state, the heat-expandable members are received by the relevant openings 510. Each heat-expandable member 300 includes an external surface 360 that expands, and engages an inner surface 550.

Similarly, a retainer 1100 may be used to adequately support, larger and/or heavier components 400 as shown in FIG. 9. The retainer 1100 includes a retainer member 1200 and a plurality of heat-expandable members 300. In one embodiment, the retainer 1100 is centrally disposed on a component package 430 of the component 400. The retainer 1100 includes at least one coupling member 1205. Each coupling member 1205 has a periphery 1220, a proximal end region 1210a, and an oppositely disposed distal end region 1210b.

The coupling members 1205 may be arranged in any manner. In one embodiment, the coupling members 1205 may be dispersed such that the mass of the component 400 is equally distributed among the plurality of heat-expandable members 300. Each coupling member 1205 can be coupled with the retainer member 1200 in any manner. In one embodiment, the coupling member is coupled with the retainer member via the proximal end region 1210a as illustrated in FIG. 9. The coupling members 1205 can be formed with differing and/or substantially uniform dimensions and materials. In an alternative embodiment, the retaining member 1200 and each coupling member 1205 are manufactured from the same material and/or are a single unit.

Each heat-expandable member 300 is coupled with the coupling member 1205 via the distal end region 1210b.

The heat-expandable member 300 transitions from an unexpanded state to an expanded state when exposed to an activation temperature. In one embodiment, the activation temperature is greater than or substantially equal to the typical solder reflow temperatures. The heat-expandable members 300 can be formed with varying and/or substantially uniform dimensions, heat-expandable materials, and activation temperatures. If some or all of the heat-expandable members 300 are formed as an unexpanded coil 350 (FIGS. 6a and 6b), some of the unexpanded coils 350 can be wrapped clockwise about the relevant retainer members 200. The other unexpanded coils 350 can be wrapped counter-clockwise to inhibit the component 400 from rotating during expansion.

The component 400 is positioned onto a printed circuit board 500, which forms at least one opening 510. When the component 400 is properly positioned onto the printed circuit board 500, the heat-expandable members 300 are in axial alignment with the openings 510. In the unexpanded state, the heat-expandable members 300 are received by the openings 510. Each heat-expandable member 300 includes an external surface 360. The heat-expandable members 300 irreversibly expands and engages an inner surface 550. This defines the relevant opening 510, and couples the component 400 with the printed circuit board 500.

Another embodiment of a retainer 2100 is illustrated in FIG. 10. The retainer 2100 includes a retainer member 200 and a heat-expandable member 2300. The heat-expandable member 2300 is coupled with an inner surface 550 to define opening 510 in a printed circuit board 500, rather than a periphery 220 of the retainer member 200. The heat-expandable member 2300 can be coupled with the inner surface 550 at any time, including before or after the printed circuit board 500 has been reflowed and inverted.

The retainer member 200 is produced in the manner described above. The retainer member 200 includes a proximal end region 210a and an oppositely disposed distal end region 210b.

The heat-expandable member 2300 is formed from a heat-expandable material and transitions from an unexpanded state to an expanded state when exposed to an activation temperature. The active temperature is greater than or substantially equal to the typical solder reflow temperatures. In alternative embodiments, depending upon the particular application, the activation temperature can be less than the typical solder reflow temperatures.

The heat-expandable member 2300 also has a cross-sectional profile Q, an external surface 2360, and an unexpanded internal surface 2390, which forms an unreduced channel 2380. The unreduced channel 2380 has a cross-sectional profile M. The unreduced channel 2380 can be formed at any time and extends completely, as shown in FIG. 10 or partially through the heat-expandable member 2300.

Upon transitioning into the expanded state, the heat-expandable member 2300 has expanded internal surface 2390', which defines a reduced channel 2380. The channel 2380' has a reduced cross-sectional profile M'. The cross-sectional profile Q, the cross-sectional profile M, the reduced cross-sectional profile M' can be of any suitable dimension. In one embodiment, the cross-sectional profile Q is less than a cross-sectional profile L of the opening 510. Since the unreduced channel 2380 receives the retainer member 200, a cross-sectional profile B (shown in FIGS. 1c and 1d) of the retainer member 200 is less than the cross-sectional profile M. The cross-sectional profile B is greater than or substantially equal to the reduced cross-sectional profile M'.

The retainer 100 can be coupled with a component 400 via the proximal end region 210a at any time, including before or after the component 400 has been assembled onto the printed circuit board 500. The heat-expandable member 2300 in the unexpanded state is disposed within the opening 510, and the external surface 2360 is coupled with the inner surface 550. The heat-expandable member 2300 can be completely disposed within, as shown in FIG. 10, or extend from the opening 510 adjacent to a primary side 530 and/or a secondary side 540 of the printed circuit board 500.

An unexpanded width P of the heat-expandable member 2300 can be any suitable dimension. In one embodiment, the unexpanded width P is less than or equal to a thickness T of the printed circuit board 500 so that the heat-expandable member 2300 is disposed completely within the opening 510. If the unexpanded width P exceeds the thickness T, the heat-expandable member 2300 can extend from the opening 510 adjacent to the primary side 530 and/or the secondary side 540. In an alternative embodiment, the heat-expandable member 2300 does not extend from the opening 510 adjacent to the secondary side 540 and is recessed by at least 0.010 inches with respect to the heat-expandable member 300.

The external surface 2360 can be coupled with the inner surface 550 in any manner, such as an adhesive, a clamp, and/or a fastener. An automated insertion tool or machine (not shown) can be used to insert the heat-expandable member 2300 into the opening 510 and to couple the external surface 2360 with the inner surface 550.

When the component 400 is positioned onto the printed circuit board 500, the distal end region 210b is in axial alignment with the unreduced channel 2380 and/or the opening 510. In the unexpanded state, the distal region 201b is received by the unreduced channel 2380 and/or the opening 510. The distal end region 210b can extend from the unreduced channel 2380 and/or the opening 510. In an alternative embodiment, the distal end region 210b is completely disposed within the unreduced channel 2380 and/or the opening 510 as shown in FIG. 11.

Once positioned onto the primary side 530, the component 400 may be held in place via, solder paste 610 and/or gravity. When the printed circuit board 500 is exposed to ambient temperatures that approach the typical solder reflow temperatures during assembly, the heat-expandable member 2300 likewise heats. Upon reaching the activation temperature, the heat-expandable member 2300 activates to expand and to enter the expanded state before or as the solder paste 610 begins to liquefy as shown in FIG. 12.

The cross-sectional profile Q is inhibited from expanding. As a result, the cross-sectional profile M decreases in size and forms the reduced cross-sectional profile M' of the reduced channel 2380'. The expanded internal surface 2390' extends toward and contacts the periphery 220, because the reduced cross-sectional profile M' is less than or equal to the cross-sectional profile B of the retainer member 200. As the heat-expandable material continues to expand, the expanded internal surface 2390' presses against and engages the periphery 220 in any manner. As assembly continues, the solder paste 610 liquefies and forms solder connections 600, coupling the component 400 with the printed circuit board 500 as shown in FIG. 13.

When the solder connections 600 are permitted to cool and solidify, the component 400 is properly assembled onto the printed circuit board 500. As the retainer 2100 cools, the heat-expandable member 2300 remains in the expanded state. The reduced cross-sectional profile M' of the reduced channel 2380' is maintained and the expanded internal surface 2390' continues to engage the periphery 220. The printed circuit board 500 subsequently can be inverted and reflowed. The retainer 2100 withstands decomposition and/or remains functionally stable at temperatures exceeding the typical solder reflow temperatures. Accordingly, the retainer 2100 remains functionally stable during the subsequent reflow stage. The engagement between the periphery 220 and the expanded internal surface 2390' is maintained as some or all of the solder connections 600 again liquefy. The retainer 2100 maintains the position of the inverted component 400 during the subsequent reflow stage, and the inverted component 400 is inhibited from separating from the printed circuit board 500 and/or from becoming misaligned with one or more relevant mounting surfaces 520. Thus, when the solder connections 600 cool and again solidify after the subsequent reflow stage, the component 400 remains properly assembled.

As previously discussed, the heat-expandable member 2300 can be coupled with the inner surface 550 after the component 400 has been assembled onto the printed circuit board 500. Specifically, after being received by the opening 510 and being positioned adjacent to the component package 430, the retainer member 200 can be coupled with the assembled component 400 in any manner. In the unexpanded state, the heat-expandable member 2300 can be substantially disposed within, and axially aligned with, the opening 510 and coupled with the inner surface 550. The heat-expandable member 2300 can be coupled with the inner surface 550 before or after the retainer member 200 is coupled with the assembled component 400. Unlike the prior discussion, the heat-expandable member 2300 is not activated while the assembled component 400 is being assembled during the first convection reflow stage. Instead, the heat-expandable member 2300 activates, entering an expanded state, as the ambient temperature surrounding the printed circuit board 500 approaches the typical solder reflow temperatures during the second convection reflow stage.

The heat-expandable member 2300 is formed from the heat-expandable material with the activation temperature that is less than or equal to the typical solder reflow temperatures. The heat-expandable member 2300 expands, substantially uniformly from the inner surface 550 and enters the expanded state before the solder connections 600 associated with the assembled component 400 softens and/or liquefies. The expanded internal surface 2390' contacts and engages the periphery 220 of the retainer member 200, supporting the assembled component 400 during the second convection reflow stage.

Figure 14A:
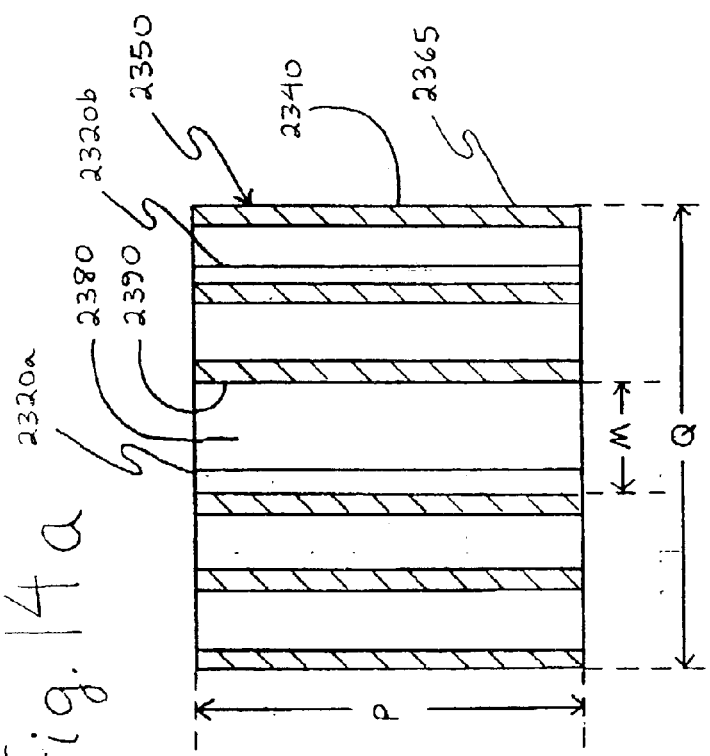
FIG. 14a is a side view of an alternative embodiment of an unexpanded heat-expandable member for the retainer of FIG. 10.

In one embodiment, a retainer 2100 can include a retaining member 200 and a heat-expandable member 2300 that is manufactured from a shape memory alloy. The retainer member 200 includes a periphery 220, a proximal end region 210a, and an oppositely disposed distal end region 210b. As illustrated in FIGS. 14a and 14b, the shape memory alloy can be formed as an unexpanded coil 2350 in the manner described above with respect to the coil 350. The coil 2350 activates or expands to form an expanded coil (not shown).

In one embodiment, the coil 2350 is substantially cylindrical when exposed to an activation temperature. To train the shape memory alloy to remember the shape of the expanded coil, the heat-expandable member 2300 can be heated at or above a training temperature to place the shape memory alloy in the austenite phase. The expanded coil includes an expanded external surface that defines an expanded cross-sectional profile (not shown) and an expanded internal surface (not shown) that defines a reduced channel (not shown). A proximal end region 2320a of the shape memory alloy is shaped from the reduced channel, which has a reduced cross-sectional profile (not shown) that is less than or substantially equal to a cross-sectional profile B (shown in FIGS. 1c and 1d) of the retainer member 200. A distal end region 2320b of the shape memory alloy then is wrapped around the reduced channel in any manner, such as clockwise or counter-clockwise. The expanded external surface is disposed away from the reduced channel. The distal end region 2320b completes at least one revolution around the reduced channel. The expanded coil can include any number of complete or partial revolutions. An outer revolution 2365 of the expanded coil is substantially uniformly disposed about the reduced channel and defines the expanded cross-sectional profile.

When cooled to a martensite finish temperature, the shape memory alloy enters a martensite phase, remembering and maintaining the shape of the expanded coil. Upon entering the martensite phase, the shape memory alloy can be formed into the shape of the unexpanded coil 2350, which may be substantially cylindrical. As illustrated in FIGS. 14a and 14b, the unexpanded coil 2350 includes an unexpanded external surface 2340 that defines an unexpanded cross-sectional profile Q and an unexpanded internal surface 2390. The unexpanded surface 2390 defines an unreduced channel 2380.

The unreduced channel 2380 receives a distal end region 210b of the retainer member 200. The distal end region 2320b forms the unexpanded cross-sectional profile Q, which may be substantially equal to the expanded cross-sectional profile of the expanded coil. The proximal end region 2320a is reshaped from the unreduced channel 2380. The unreduced channel 2380 has a reduced cross-sectional profile M that is greater than or substantially equal to the cross-sectional profile B of the retainer member 200.

The distal end region 2320b then is wrapped around the reduced channel in any manner, such as being wrapped in a substantially similar direction as the expanded coil. Analogously to the expanded coil, the unexpanded coil 2350 may complete at least one revolution around the unreduced channel 2380 with the external surface 2340 disposed away from the unreduced channel 2380. The unexpanded coil 2350 may be formed from the expanded coil by increasing the number of revolutions about the unreduced channel 2380 and/or decreasing a spacing between consecutive revolutions. As was discussed in more detail above, the outer revolution 2365 may be substantially uniformly disposed about the unreduced channel 2380. Once formed, the shape memory alloy retains the shape of the unexpanded coil 2350 until exposed to the activation temperature.

In the manner described above, the retainer member 200 is coupled with a component 400 (shown in FIG. 10). The unexpanded coil 2350 is disposed within an opening 510 (shown in FIG. 10) formed in a printed circuit board 500 (shown in FIG. 10). The external surface 2340 is coupled with an inner surface 550 (shown in FIG. 10) that defines the opening 510. When the component 400 is positioned on the printed circuit board 500, the retainer member 200 is substantially axially aligned with and disposed within the unreduced channel 2380. During assembly, an ambient temperature surrounding the printed circuit board 500 approaches the solder reflow temperature, and the shape memory alloy likewise heats.

Upon reaching the activation temperature, the shape memory alloy begins to recover the expanded coil. The expanded coil unwinds and expands substantially uniformly, from the unexpanded coil 2350. As the expanded coil is recovered, the unexpanded internal surface 2390 extends toward and contacts the periphery 220 of the retainer member 200 with respect to the expanded internal surface 2390. The reduced cross-sectional profile of the reduced channel is less than or equal to the cross-sectional profile B of the retainer member 200. Upon contacting the periphery 220, the expanded internal surface can continue to expand, thereby pressing against and engaging the periphery 220 until the shape of the expanded coil is substantially recovered.

Returning to FIG. 11, the unexpanded internal surface 2390 can be treated to enhance the engagement with the periphery 220. The engagement can be enhanced by any manner known in the art, such as by applying an adhesive to the unexpanded internal surface 2390 and/or the periphery 220. For example, the unexpanded internal surface 2390 can be roughened by any process, such as scoring. In an alternative embodiment, a conforming material (not shown), such as a spongy material, can be disposed on the unexpanded internal surface 2390.

A sleeve (not shown) with an internal surface (not shown) that is roughened or coupled with a conforming material can be disposed within the unreduced channel 2380 and coupled with the unexpanded internal surface 2390. The sleeve can be formed from a rough or conforming material. The internal surface of the sleeve can be roughened or coupled with the conforming material in any manner known in the art. The periphery 220 also can be treated, such as by roughening, to enhance the engagement with the unexpanded internal surface 2390. The periphery 220 can be roughened by any manner known in the art such as scoring or notching. A conforming material (not shown) also can be coupled with the periphery 220 to engage the unexpanded internal surface 2390.

A retainer 2110 that includes a retainer member 200 and heat-expandable members 2300 as illustrated in FIG. 15. The retainer member 200 includes a proximal end region 210a and an oppositely disposed distal end region 210b. Unlike the retainer 110 illustrated in FIG. 7, each heat-expandable member 2300 is coupled with an inner surface 550 defining an opening 510 in a printed circuit board 500 rather than a periphery 220 of the retainer member 200. Each heat-expandable member 2300 transitions from an unexpanded state to an expanded state when exposed to an activation temperature. The activation temperature is greater than or substantially equal to the typical solder reflow temperatures. As described in more detail above, each heat-expandable member 2300 is formed from a heat-expandable material. In the unexpanded state, the heat-expandable member includes an external surface 2360 and an unreduced internal surface 2390, which forms an unreduced channel 2380. Each unreduced channel 2380 has a cross-sectional profile M that is greater than a cross-sectional profile B (shown in FIGS. 1c and 1d) of the retainer member 200. The unreduced channels 2380 are substantially axially aligned and can be formed at any time. Upon entering the expanded state, each of the expanded heat-expandable members 2300 has an expanded internal surface 2390', which defines a reduced channel 2380'. Each reduced channel 2380' has a reduced cross-sectional profile M' that is less than or substantially equal to the cross-sectional profile B of the retainer member 200.

It should be noted that the dimension, the heat-expandable materials, and the activation temperatures each can vary or be substantially uniform among the heat-expandable members 2300. The retainer member 200 is coupled with a component 400. The component 400 is positioned on the printed circuit board 500. Being in the unexpanded state, the heat-expandable members 2300 are axially aligned with and disposed within the opening 510. To inhibit the relevant heat-expandable member 2300 from inclining relative to a longitudinal axis of the opening 510, each unexpanded width P and expanded width P' is sufficient large. Each spacing R between adjacent heat-expandable members 2300 is sufficiently small.

Upon activation and entering the expanded state, each expanded internal surface 2390' engages the periphery 220. If some or all of the of heat-expandable members 2300 are formed as an unexpanded coil 2350 in the manner described above with respect to FIGS. 14a and 14b, some of the unexpanded coils 2350 can be wrapped clockwise about the opening 510. The other unexpanded coils 2350 can be wrapped counter-clockwise to inhibit the component 400 from rotating during expansion.

Although a single retainer 2100 has been previously shown and described as being used in conjunction with a component 400, many retainers 2100 may be used to adequately support larger and/or heavier components 400 as illustrated in FIG. 16. Each retainer 2100 includes a retainer member 200 and at least one heat-expandable member 2300. Each of the retainer members 200 is produced in the manner described above with respect to the retainer member 200 and can be formed with differing and/or uniform dimensions, heat-expandable materials, and activation temperatures. Each retainer member 200 is non-centrally disposed on a component package 430 of the component 400. The retainer members 200 may be arranged in any manner. In one embodiment, the retainer members are dispersed such that the mass of the component 400 is equally distributed among the retainers 2100. Each heat-expandable member 2300 transitions from an unexpanded state to an expanded state when exposed to an activation temperature. The activation temperature is greater than or substantially equal to the typical solder reflow temperatures.

Each heat-expandable member 2300, in the unexpanded state is disposed within a relevant opening 510 formed in a printed circuit board 500. Each heat-expandable member 2300 is coupled with an inner surface 550 that defines the relevant opening 510. The heat-expandable members 2300 include an unexpanded internal surface 2390, which defines an unreduced channel 2380. Each unreduced channel 2380 is substantially axially aligned with the relevant opening 510. It should be noted that the heat-expandable members 2300 can be formed with varying and/or substantially uniform dimensions, heat-expandable materials, and activation temperatures.

If some or all of the heat-expandable members 2300 are formed as an unexpanded coil 2350 as discussed in more detail above with respect to FIGS. 14a and 14b, some of the unexpanded coils 2350 can be wrapped clockwise about the opening 510. The other unexpanded coils 2350 can be wrapped counter-clockwise to inhibit the component 400 from rotating during expansion. When the component 400 is positioned onto the printed circuit board 500, each retainer member 200 is axially aligned with, and received by, the relevant opening 510 and/or the relevant unreduced channel 2380. When activated during assembly, the heat-expandable members 2300 enter the expanded state. The unexpanded internal surface 2390 of each heat-expandable member 2300 engages the periphery 220 of the relevant retainer member 200, coupling the component 400 with the printed circuit board 500.

Similarly, a retainer 2105 may be used to adequately support, for example, larger and/or heavier components 400 as shown in FIG. 17. The retainer 2105 includes a retainer member 2200 and heat-expandable members 2300.

The retainer member 2200 includes at least one coupling member 2205. Each coupling member 2205 has a periphery 2220, a proximal end region 2210a, and an oppositely disposed distal end region 2210b. The retainer member 2200 is centrally disposed on a component package 430 of the component 400 such that the mass of the component 400 is equally distributed among the coupling members 2205. Each coupling member 2205 can be coupled with the retainer member 2200 in any manner, for example, via the proximal end region 2210a. The coupling members 2205 can be formed with differing and/or substantially uniform dimensions, heat-expandable materials, and activation temperatures. The retainer member 2200 and each coupling member 2205 may be manufactured from the same material and/or comprise a single unit.

Each heat-expandable member 2300 transitions from an unexpanded state to an expanded state when exposed to an activation temperature. The activation temperature is greater than or substantially equal to the typical solder reflow temperatures. Each heat-expandable member 2300 in the unexpanded state is disposed within a relevant opening 510 formed in a printed circuit board 500. The heat-expandable member 2300 is coupled with an inner surface 550 that defines the relevant opening 510. The heat-expandable members 2300 include an unexpanded internal surface 2390, which defines an unreduced channel 2380. The unreduced channel 2380 is substantially axially aligned with the opening 510. It should be noted that the heat-expandable members 2300 can be formed with varying and/or substantially uniform dimensions, heat-expandable materials, and activation temperatures. If some or all of the heat-expandable members 2300 are formed as an unexpanded coil 2350 as was discussed in more detail above with respect to FIGS. 14a and 14b. Some of the unexpanded coils 2350 can be wrapped clockwise about the opening 510. The other unexpanded coils 2350 can be wrapped counter-clockwise to inhibit the component 400 from rotating during expansion. When the component 400 is positioned onto the printed circuit board 500, each coupling member 2205 is axially aligned with, and received by, the relevant opening 510 and/or the relevant unreduced channel 2380. When activated during assembly, the heat-expandable members 2300 enter the expanded state. The unexpanded internal surface 2390 of each heat-expandable member 2300 engages the periphery 220 of the relevant coupling member 2205, coupling the component 400 with the printed circuit board 500.

While the invention is susceptible to various modifications and alternative forms, specific examples thereof have been shown by way of example in the drawings and are herein described in detail. It should be understood, however, that embodiments of the invention are not to be limited to the particular forms or methods disclosed, but to the contrary, the invention is to cover all modifications, equivalents, and alternatives falling within the spirit and scope of the appended claims.

What is claimed is:

1. A circuit board assembly comprising:
   a circuit board;
   an electronic component;
   a plurality of electric contacts between the circuit board and the electronic component; and
   a retainer including a retainer member and a heat-expandable member, the electronic component secured to the retainer member, the heat-expandable member secured to the retainer member, the heat-expandable member expanding when exposed to an activation temperature to engage with a portion of the circuit board, the retainer allowing for movement of the electronic component in a first direction towards the circuit board while simultaneously preventing movement of the circuit board and the electronic component in a second direction away from one another when the electric contacts melt.

2. The circuit board assembly of claim 1 wherein the heat-expandable member is disposed around a periphery of the retainer member.

3. The circuit board assembly of claim 1 wherein the activation temperature is at least equal to a solder reflow temperature.

4. The circuit board assembly of claim 1 wherein the expansion of the heat-expandable member is thermally irreversible.

5. The circuit board assembly of claim 1 wherein the portion of the circuit board is an opening in the circuit board.

6. The circuit board assembly of claim 1 wherein the heat-expandable member is in the shape of a coil wrapped around the retainer member.

7. The circuit board assembly of claim 1 wherein the heat-expandable member is made of a shape memory alloy.

8. The circuit board assembly of claim 1 wherein the heat-expandable member forms an unexpanded coil when exposed to a second temperature, said second temperature being less than said activation temperature.

9. The circuit board assembly of claim 1 wherein the heat-expandable member is trained to remember said expanded coil when exposed to a training temperature.

10. The circuit board assembly of claim 1, wherein the heat-expandable member is trained to remember said expanded coil when exposed to a training temperature.

11. The circuit board assembly of claim 10 wherein a periphery of the retainer member is roughened.

12. The circuit board assembly of claim 10 wherein a periphery of the retainer member is provided with a conforming material.

13. A retainer for a circuit board comprising:
    a retainer member with a first end and a second end, an electronic component securable to the first end; and
    a heat-expandable member secured to the second end of the retainer member, the heat-expandable member expanding when exposed to an activation temperature to engage with a portion of the circuit board, the retainer with the heat-expandable member allowing for movement of the electronic component in a first direction towards the circuit board while simultaneously preventing movement of the circuit board and the electronic component in a second direction away from one another when the electric contacts melt.

14. The retainer of claim 13, wherein the heat-expandable member is disposed around a periphery of the retainer member.

15. The retainer of claim 13 wherein the activation temperature is at least equal to a solder reflow temperature.

16. The retainer of claim 13 wherein the expansion of the heat-expandable member is thermally irreversible.

17. The retainer of claim 13 wherein the portion of the circuit board is an opening in the circuit board.

18. The retainer of claim 13 wherein the heat-expandable member is in the shape of a coil wrapped around the retainer member.

19. The retainer of claim 18 wherein the heat-expandable member is made of a shape memory alloy.

20. The retainer of claim 13 wherein the heat-expandable member forms an unexpanded coil when exposed to a second temperature, the second temperature being less than said activation temperature.

21. The retainer of claim 19 wherein the heat-expandable member is trained to remember the expanded coil when exposed to a training temperature.

* * * * *